(12) United States Patent  
Kinoshita et al.

(10) Patent No.: US 12,453,121 B2  
(45) Date of Patent: Oct. 21, 2025

(54) SEMICONDUCTOR DEVICE

(71) Applicant: HITACHI POWER SEMICONDUCTOR DEVICE, LTD., Hitachi (JP)

(72) Inventors: Koyo Kinoshita, Hitachi (JP); Takahiro Morikawa, Hitachi (JP); Tatsunori Murata, Hitachi (JP); Kan Yasui, Hitachi (JP)

(73) Assignee: HITACHI POWER SEMICONDUCTOR DEVICE, LTD., Ibaraki (JP)

( * ) Notice: Subject to any disclaimer, the term of this patent is extended or adjusted under 35 U.S.C. 154(b) by 376 days.

(21) Appl. No.: 18/249,282

(22) PCT Filed: Nov. 18, 2021

(86) PCT No.: PCT/JP2021/042454  
§ 371 (c)(1),  
(2) Date: Apr. 17, 2023

(87) PCT Pub. No.: WO2022/124042  
PCT Pub. Date: Jun. 16, 2022

(65) Prior Publication Data  
US 2023/0420555 A1  Dec. 28, 2023

(30) Foreign Application Priority Data  
Dec. 8, 2020 (JP) .................................. 2020-203507

(51) Int. Cl.  
*H10D 30/66* (2025.01)  
*H10D 62/10* (2025.01)  
*H10D 62/17* (2025.01)

(52) U.S. Cl.  
CPC ......... *H10D 30/665* (2025.01); *H10D 30/668* (2025.01); *H10D 62/107* (2025.01); *H10D 62/393* (2025.01)

(58) Field of Classification Search  
CPC .. H10D 30/665; H10D 30/668; H10D 62/107; H10D 62/393  
(Continued)

(56) References Cited

U.S. PATENT DOCUMENTS

| | | |
|---|---|---|
| 2008/0087951 A1 | 4/2008 | Takaya et al. |
| 2015/0129895 A1 | 5/2015 | Takeuchi et al. |

(Continued)

FOREIGN PATENT DOCUMENTS

| | | |
|---|---|---|
| EP | 0813250 A2 | 12/1997 |
| JP | H10-70271 | 3/1998 |

(Continued)

OTHER PUBLICATIONS

International Search Report, mailed Jan. 18, 2022, for International Application No. PCT/JP2021/042454.

*Primary Examiner* — Igwe U Anya  
(74) *Attorney, Agent, or Firm* — Baker Botts L.L.P.

(57) ABSTRACT

Provided is a semiconductor device where an electric field applied to an electric field protection layer at a bottom of a trench gate electrode of an active region is relaxed and an avalanche withstand voltage is improved. The semiconductor device includes: an active region that has multiple gate trenches, a trench gate electrode in each gate trench, and a P body layer provided to a section other than the gate trenches; and a termination region disposed on the outer periphery of the active region. Additionally, an electric field protection layer is provided to the bottom of each gate trench of the active region, an electric field relaxation layer is between the active region and the termination region, the (Continued)

bottom surface of the electric field relaxation layer is shallower than that of the electric field protection layer, and the electric field relaxation layer is electrically connected to the P body layer.

15 Claims, 12 Drawing Sheets

(58) Field of Classification Search
USPC .......................................................... 257/288
See application file for complete search history.

(56) References Cited

U.S. PATENT DOCUMENTS

| | | |
|---|---|---|
| 2017/0012121 A1 | 1/2017 | Saito et al. |
| 2017/0288014 A1 | 10/2017 | Saito et al. |
| 2017/0301788 A1* | 10/2017 | Fukui .................... H10D 64/519 |
| 2018/0114829 A1 | 4/2018 | Nagaoka et al. |
| 2019/0333986 A1* | 10/2019 | Fukui .................... H10D 62/154 |
| 2019/0378922 A1* | 12/2019 | Nakano ................ H10D 62/106 |
| 2021/0036102 A1* | 2/2021 | Kyogoku ............. H10D 30/668 |

FOREIGN PATENT DOCUMENTS

| | | |
|---|---|---|
| JP | 2006-128507 | 5/2006 |
| JP | 2013-258369 | 12/2013 |
| JP | 2015-126086 | 7/2015 |
| JP | 2016-115692 | 6/2016 |
| JP | 2017-092364 | 5/2017 |
| JP | 2017-107940 | 6/2017 |
| JP | 2018-067651 | 4/2018 |
| JP | 2018-133442 | 8/2018 |
| JP | 2019-117867 | 7/2019 |
| JP | 2020-113633 | 7/2020 |

\* cited by examiner

SEMICONDUCTOR DEVICE

TECHNICAL FIELD

The present invention relates to a semiconductor device.

BACKGROUND ART

In order to protect a gate insulating film against a large current and a large voltage, a SiC trench metal-oxide-semiconductor field effect transistor (MOSFET) known as a power semiconductor device used for controlling and converting a power generally adopts a withstand voltage measure such as providing an electric field protection layer at a bottom of a gate trench.

For example, as a structure corresponding to the electric field protection layer at the bottom of the gate trench, PTL 1 discloses a structure in which a p-type first floating region 36 is provided at a position below a first trench 21 in a cell area A1, and PTL 2 discloses a structure in which a P floating region 51 is provided at a bottom of a gate trench 21 in a cell area as an electric field protection layer at a bottom of a gate trench.

More specifically, PTL 1 discloses a semiconductor device 10 including a semiconductor substrate 12 in which a cell area A1 and a termination area A2 are partitioned. The cell area A1 includes a first trench 21, a gate electrode 31 accommodated in the first trench 21, and a p-type first floating region 36 provided at a position below the first trench 21, and the termination area A2 includes a second trench 22 and a second floating region 42 provided at a position below the second trench 22. A depth D2 of an innermost peripheral second trench 22i is set to be shallower than a depth D1 of the first trench 21 such that a first distance 41 (distance between a bottom surface 31a of the gate electrode 31 and an upper end 36a of the first floating region 36 in an up-down direction) and a second distance Z2 (distance between an upper end 42a of an innermost periphery second floating region 42i and a body layer 25 in the up-down direction) are equal to each other.

In addition, PTL 2 discloses a semiconductor device in which a gate trench 21 and a P floating region 51 are formed in a cell area, a termination trench 62 and a P floating region 53 are formed in a termination area, has a structure similar to the structure of the gate trench 21 is formed in the termination trench 62 among three termination trenches 621 (termination trench 621, termination trench 622, and termination trench 623), and has a structure filled with an insulator such as silicon oxide is formed in the other termination trenches. The P floating region 51 is a region formed by implanting impurities from a bottom surface of the gate trench 21 and the P floating region 53 is a region formed by implanting impurities from a bottom surface of the termination trench 62.

Note that, although the electric field protection layer is not provided at the bottom of the gate trench, PTL 3 discloses a semiconductor device including a semiconductor substrate having an element region in which a trench gate is provided, a termination region positioned outside the element region, and a boundary region positioned between the element region and the termination region. A first diffusion layer of a conductivity type different from the conductivity type of the semiconductor substrate, a trench having a depth larger than a thickness of the first diffusion layer in the semiconductor substrate, and a second diffusion layer that is in contact with the first diffusion layer on a bottom side of the trench and has the same conductivity type as the first diffusion layer are provided in each of the termination region and the boundary region.

CITATION LIST

Patent Literature

PTL 1: JP 2017-107940 A
PTL 2: JP 2006-128507 A
PTL 3: JP 2019-117867 A

SUMMARY OF INVENTION

Technical Problem

However, a larger electric field is likely to be applied to the electric field protection layer of the gate trenches arranged at ends of the active region than in other portions (curvature of an equipotential line is larger than in other portions), and a decrease in an avalanche breakdown voltage is caused. Accordingly, it is desired to develop a structure for relaxing the electric field related to the electric field protection layer of the gate trench arranged at the end of the active region.

Here, although PTL 1 and PTL 2 disclose the configuration in which the floating region (second floating region 42 of PTL 1 and P floating region 53 of PTL 2) is provided in the termination area (corresponding to the termination region), there is a problem that an effect of relaxing an electric field related to the electric field protection layer of the gate trenches arranged at the ends of the active region may be insufficient unless a depth and a thickness of the floating region are sufficiently increased as will be described later. In addition, since PTL 3 does not presuppose the presence of the electric field protection layer in the active region, the relaxation of the electric field of the electric field protection layer in the active region is not disclosed.

In view of the above circumstances, an object of the present invention is to provide a semiconductor device that is easily manufactured, relaxes an electric field applied to an electric field protection layer provided in gate trenches at ends of an active region, and improves an avalanche breakdown voltage.

Solution to Problem

One aspect of the present invention for solving the above problems is a semiconductor device including an active region including a plurality of gate trenches, trench gate electrodes provided in the gate trenches, and a P body layer provided at a portion other than the gate trenches, and a termination region arranged in an outer periphery of the active region. The semiconductor device includes an electric field protection layer at a bottom of the gate trench of the active region. An electric field relaxation layer is provided between the active region and the termination region, a bottom surface of the electric field relaxation layer is shallower than a bottom surface of the electric field protection layer, and the electric field relaxation layer is electrically connected to the P body layer.

A more specific configuration of the present invention is described in the claims.

Advantageous Effects of Invention

According to the present invention, it is possible to provide a semiconductor device which is easily manufactured, relaxes an electric field applied to an electric field protection layer provided in gate trenches at ends of an active region, and improves an avalanche breakdown voltage.

Other objects, configurations, and effects will be made apparent in the following descriptions.

DESCRIPTION OF EMBODIMENTS

Hereinafter, a semiconductor device of the present invention will be described in detail. In all drawings for describing the present invention, components having the same function are denoted by the same reference signs, and repeated description thereof may be omitted.

Figure 1A:
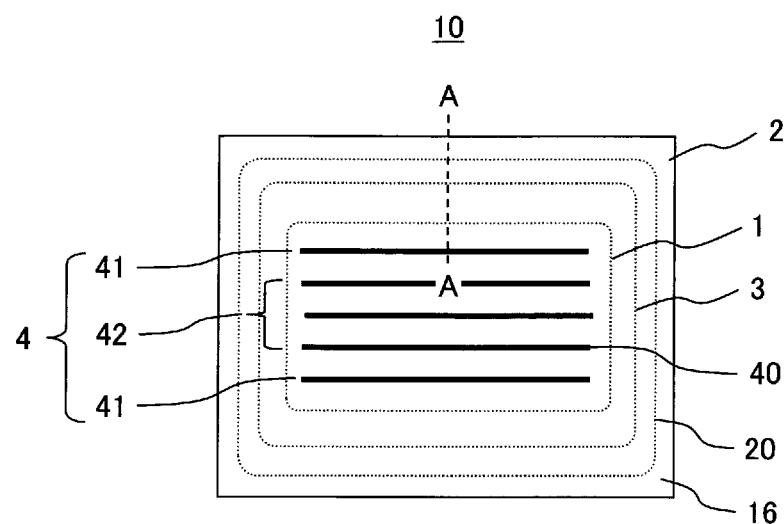
FIG. 1A is a plan view illustrating a first example of a semiconductor device of the present invention.
Figure 1B:
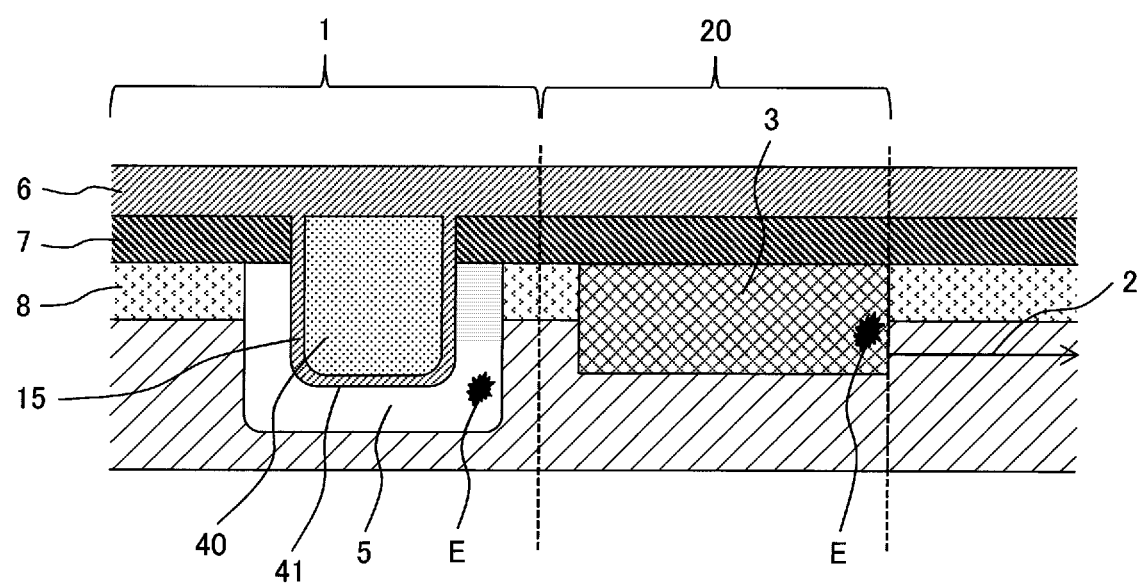
FIG. 1B is a cross-sectional view taken along line A-A of FIG. 1A.

FIG. 1A is a plan view illustrating a first example of the semiconductor device of the present invention, and FIG. 1B is a cross-sectional view taken along line A-A of FIG. 1A. As illustrated in FIGS. 1A and 1B, a semiconductor device 10 includes an active region 1 having a plurality of gate trenches 4 provided on a surface of a substrate 16 and trench gate electrodes 40 provided in the gate trenches 4, and a termination region 2 arranged on an outer periphery of the active region 1. An intermediate region 20 is provided between the active region 1 and the termination region 2. Here, among the plurality of gate trenches 4, the gate trenches 4 positioned at ends of the active region 1 on the termination region 2 side are referred to as end trenches 41. In addition, among the plurality of gate trenches 4, gate trenches 4 other than the end trenches 41 are denoted by reference sign 42. The end trenches 41 and the gate trenches 42 other than the end trenches 41 are collectively referred to as the gate trenches 4.

The trench gate electrode 40 has a configuration in which a gate electrode material is deposited in the gate trench 4 extending along one side of the substrate 16, and a plurality of trench gate electrodes are provided in a direction perpendicular to a longitudinal direction of the gate trench 4 (array direction of the gate trenches 4). The active region 1 includes a P body layer 8 provided in a portion other than the gate trench 4 in addition to the gate trench 4, and a $P^+$ layer 7 and an oxide film layer 6 (insulating film layer or $SiO_2$ layer) are stacked in this order on a surface of the P body layer 8. The oxide film layer 6 is provided to cover between the gate trench 4 and the trench gate electrode 40, and this portion functions as a gate insulating film 15. An electric field protection layer 5 is provided at a bottom of the gate trench 4, and the electric field protection layer 5 is also provided at a bottom of the end trench 41. Note that the gate trench 4 may include a dummy trench that does not perform a switching operation (does not function as a gate). Here, the dummy trench may be a dummy trench in which the gate electrode material is not provided in the gate trench 4, or may be a dummy trench in which the gate electrode material is provided in the gate trench 4 but a dummy gate electrode that is not electrically connected to a gate is provided. The end trench 41 may be a dummy trench.

Figure 20:
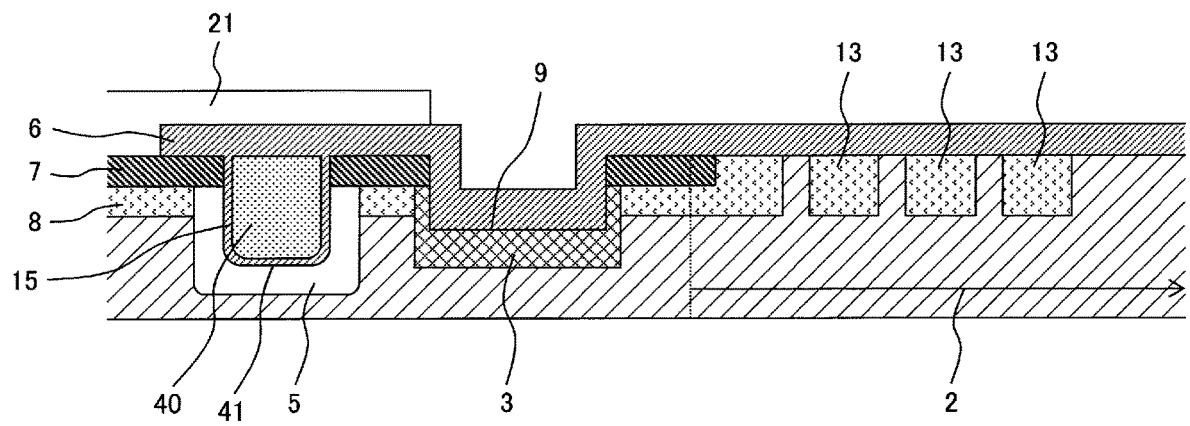
FIG. 20 is a cross-sectional view illustrating a first example of a termination structure.
Figure 21:
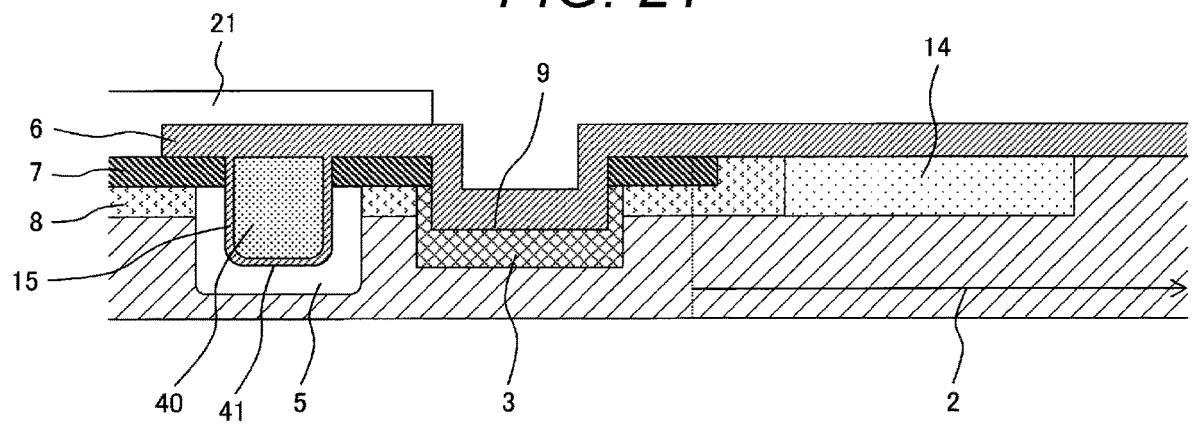
FIG. 21 is a cross-sectional view illustrating a second example of the termination structure.

In the termination region 2, a depletion layer spreads in a fan shape, and an electric field becomes strong. In order to relax this electric field, a termination structure is provided. FIG. 20 is a cross-sectional view illustrating a first example of the termination structure, and FIG. 21 is a cross-sectional view illustrating a second example of the termination structure. FIG. 20 is a structure referred to as a Field Limiting Ring structure 13, and FIG. 21 is a structure referred to as a Junction Termination Extension structure 14.

Figure 22:
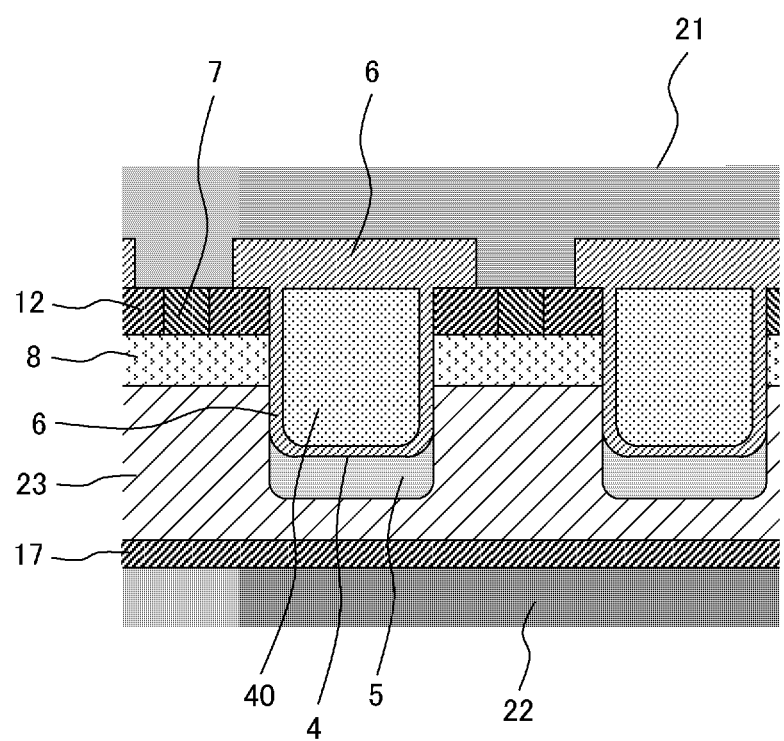
FIG. 22 is a cross-sectional view illustrating a structure of an active region in FIG. 1A.

FIG. 22 is a cross-sectional view illustrating the structure of the active region in FIG. 1A. In FIG. 1B, the structures of the end trench 41, the intermediate region 20, and the termination region 2 are mainly illustrated, but in FIG. 22, the structure of the active region 1 is illustrated. As illustrated in FIG. 22, a source electrode 21 is provided on an upper surface of a substrate 16, and a drain electrode 22 is provided on a lower surface of the substrate. In addition, an N⁻ drift layer 23 is deposited around the gate trench 4. An N⁺ layer 12 arranged so as to be in contact with the gate trench 4 is provided adjacent to the P⁺ layer 7. An N⁺ layer 17 is provided between the N⁻ drift layer 23 and the drain electrode 22.

Returning again to FIGS. 1A and 1B. An electric field relaxation layer 3 is provided in an intermediate region 20 between the active region 1 and the termination region 2, a bottom surface of the electric field relaxation layer 3 is shallower than a bottom surface of the electric field protection layer 5, and the electric field relaxation layer 3 is electrically connected to the P body layer 8. The significance of such a configuration will be described in detail later.

Figure 2:
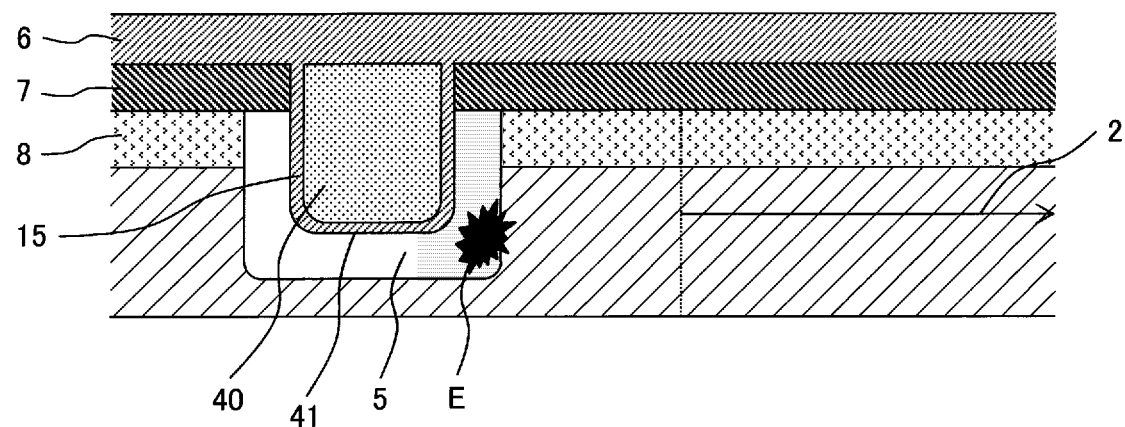
FIG. 2 is a cross-sectional view illustrating a semiconductor device having no electric field relaxation layer.

FIG. 2 is a cross-sectional view illustrating a semiconductor device having no electric field relaxation layer, and is a diagram illustrating a comparison with the configuration of FIG. 1B described above. As illustrated in FIG. 2, in a case where the electric field relaxation layer 3 is not provided, a large electric field E is applied to a corner of the electric field protection layer 5 on the termination region 2 side. By contrast, in the present invention illustrated in FIG. 1B, the electric field E applied to the electric field protection layer 5 can be relaxed by providing the electric field relaxation layer 3. That is, the electric field can be relaxed by stepwisely dividing the displacement of an equipotential line from the active region 1 to the termination region 2 and decreasing the curvature of the equipotential line near the electric field protection layer 5 of the end trench 41, and an avalanche breakdown voltage can be improved.

The electric field relaxation layer 3, the electric field protection layer 5, and the P body layer 8 can be manufactured by ion implantation. In a case where the electric field protection layer 5 is formed on a sidewall portion of the gate trench 4 by ion implantation, the electric field protection layer is obliquely implanted as necessary.

When the bottom surface of the electric field relaxation layer 3 is shallower than the P body layer 8, there is no effect of electric field relaxation. In addition, when the bottom surface is deeper than the electric field protection layer 5, the curvature of the equipotential line near the electric field relaxation layer 3 increases, and thus, there is a concern that the electric field is concentrated. Accordingly, the bottom surface of the electric field relaxation layer 3 has a depth between a bottom surface of the P body layer 8 and the bottom surface of the electric field protection layer 5.

Figure 3:
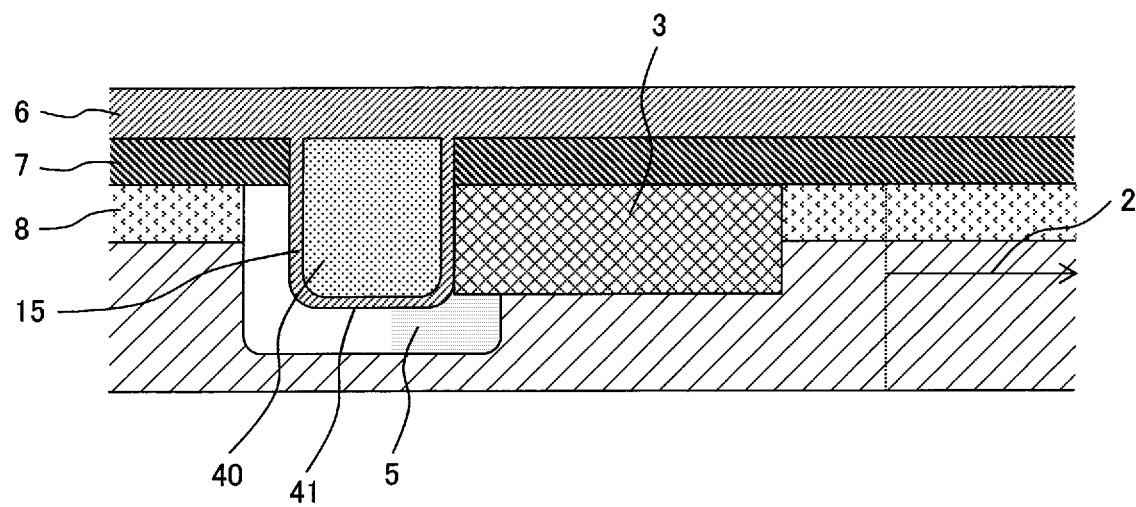
FIG. 3 is a cross-sectional view illustrating a second example of the semiconductor device of the present invention.
Figure 4:
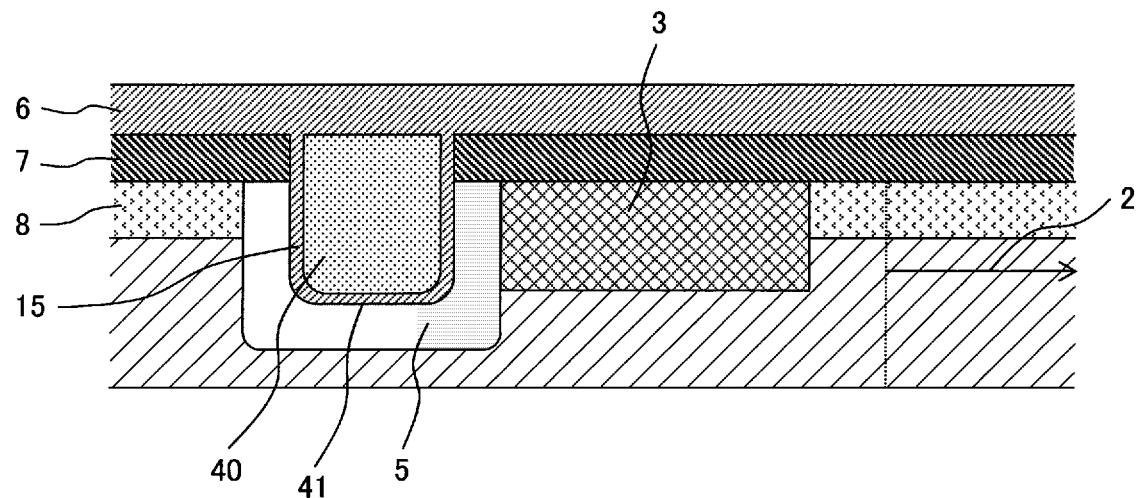
FIG. 4 is a cross-sectional view illustrating a third example of the semiconductor device of the present invention.

Although the electric field protection layer 5 and the electric field relaxation layer 3 are separated from each other in FIG. 1B described above, the effect of the present invention can be obtained even though the electric field protection layer and the electric field relaxation layer are in contact with each other. FIG. 3 is a cross-sectional view illustrating a second example of the semiconductor device of the present invention, and FIG. 4 is a cross-sectional view illustrating a third example of the semiconductor device of the present invention. As illustrated in FIG. 3, one side surface of the electric field relaxation layer 3 may be in contact with the end trench 41. In addition, one side surface of the electric field relaxation layer 3 may be in contact with the trench gate electrode 40 via the gate insulating film 15, and the bottom surface of the electric field relaxation layer 3 may be in contact with the electric field protection layer 5. In addition, as illustrated in FIG. 4, one side surface of the electric field protection layer 5 and one side surface of the electric field relaxation layer 3 may be in contact with each other. In addition, although not illustrated, the electric field relaxation layer 3 may be in contact with an end of the gate trench 4 in the longitudinal direction.

Figure 5:
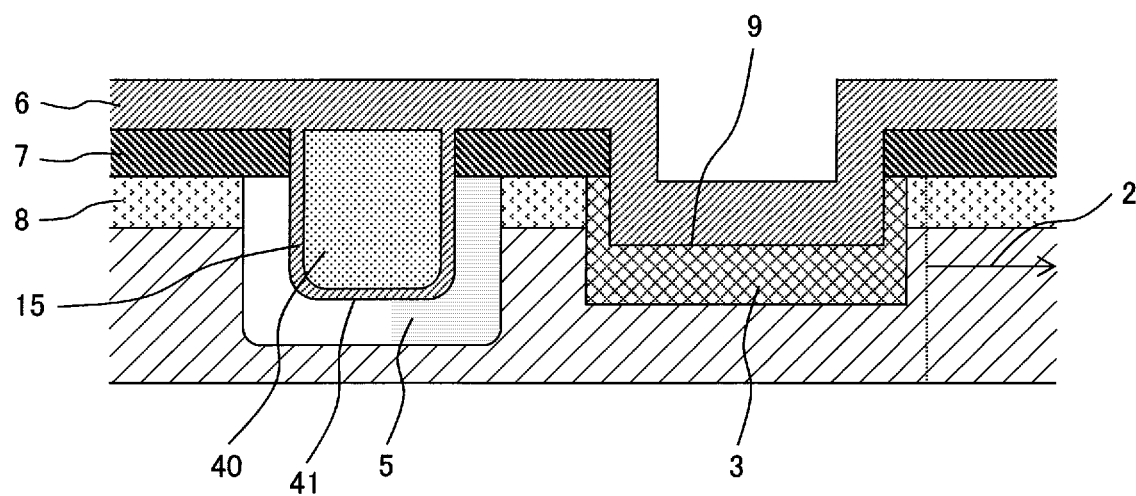
FIG. 5 is a cross-sectional view illustrating a fourth example of the semiconductor device of the present invention.

FIG. 5 is a cross-sectional view illustrating a fourth example of the semiconductor device of the present invention. As illustrated in FIG. 5, the electric field relaxation layer 3 may be provided on bottom surfaces of termination trenches 9 provided between the active region 1 and the termination region 2. With such a configuration, a film thickness of the electric field relaxation layer 3 can be reduced by a depth of the termination trench 9. The electric field relaxation layer 3 can be manufactured by ion implantation after the termination trenches 9 are formed. In a case where the electric field relaxation layer 3 is formed on a sidewall portion of the termination trench 9 by ion implantation, the electric field relaxation layer is obliquely implanted as necessary. For example, in a case where the termination trench 9 is shallow, oblique implantation may be omitted.

Figure 6:
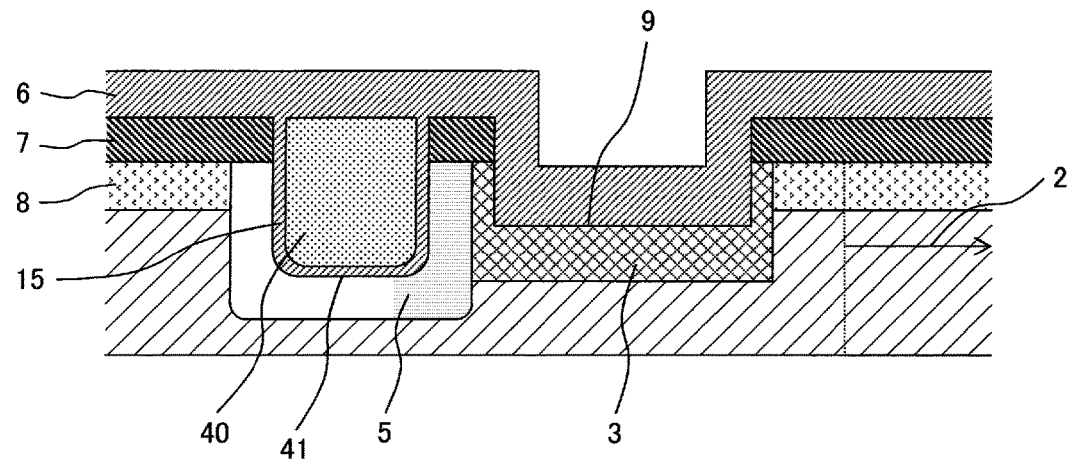
FIG. 6 is a cross-sectional view illustrating a fifth example of the semiconductor device of the present invention.

FIG. 6 is a cross-sectional view illustrating a fifth example of the semiconductor device of the present invention. As illustrated in FIG. 6, in the configuration in which the termination trenches 9 are provided, one side surface of the electric field protection layer 5 and one side surface of the electric field relaxation layer 3 may be in contact with each other.

Figure 7:
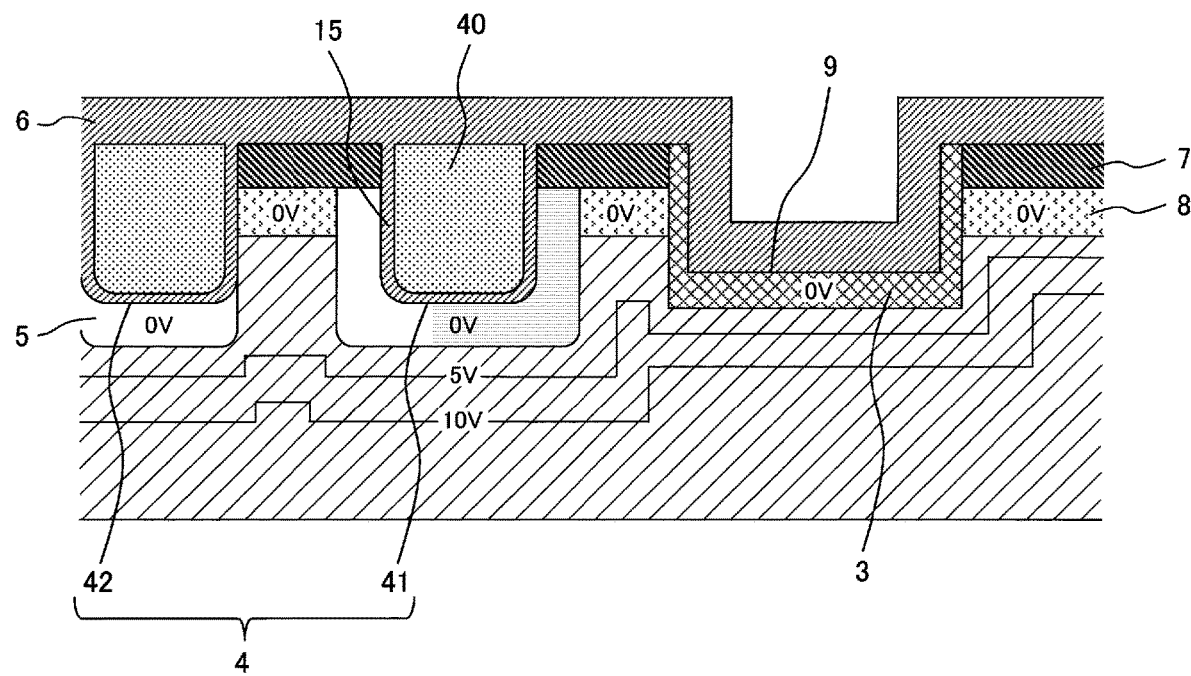
FIG. 7 is a cross-sectional view of a fourth example of the semiconductor device of the present invention and a diagram illustrating an equipotential line.
Figure 8:
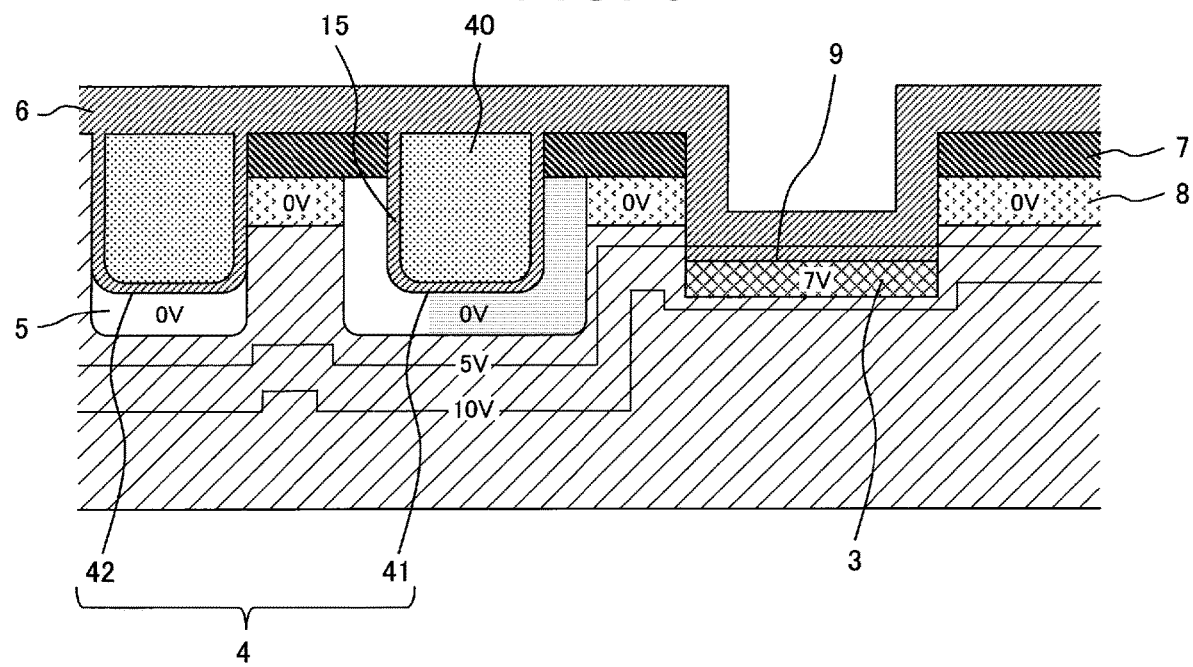
FIG. 8 is a cross-sectional view of a configuration in which the electric field relaxation layer is not connected to a P body layer and a diagram illustrating an equipotential line.
Figure 9:
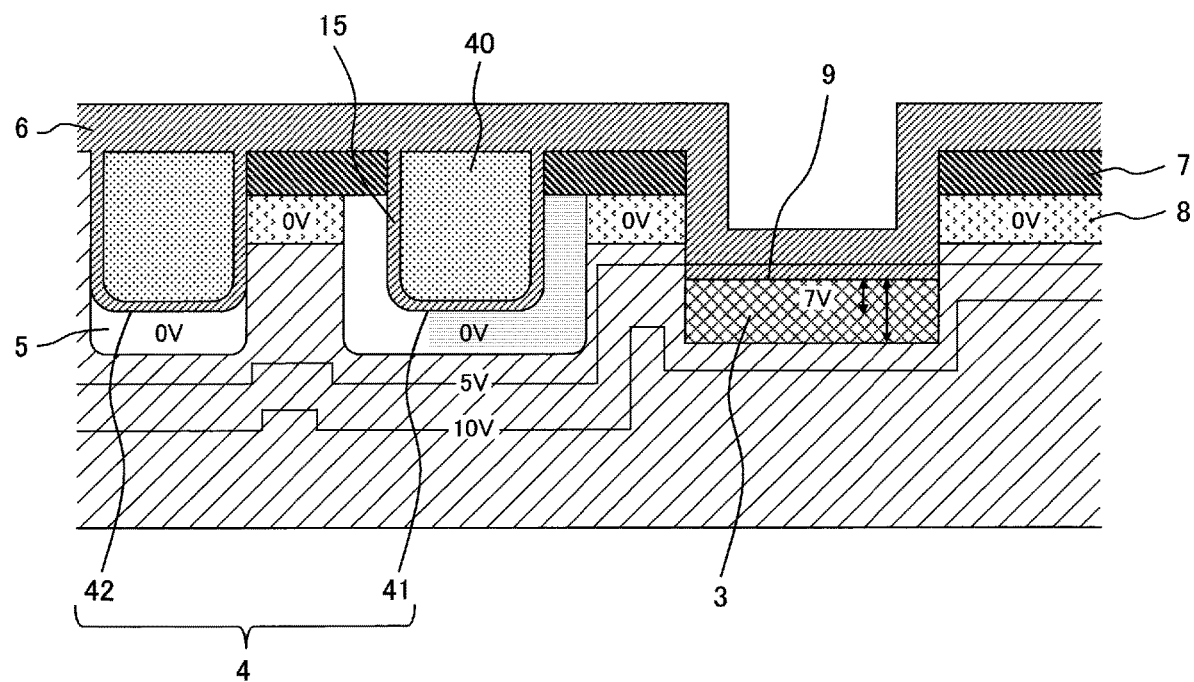
FIG. 9 is a cross-sectional view of a configuration in which the electric field relaxation layer is not connected to the P body layer and a diagram illustrating an equipotential line.

Here, the significance of the configuration in which the electric field relaxation layer 3 is electrically connected to the P body layer 8 will be described. FIG. 7 is a diagram illustrating an equipotential line with a cross-sectional view of the fourth example of the semiconductor device of the present invention, and FIGS. 8 and 9 are diagrams illustrating an equipotential line with a cross-sectional view of a configuration in which the electric field relaxation layer is not connected to the P body layer. In a case where FIG. 7 is compared with FIG. 8, the displacement of the equipotential line around the end trench 41 is gentler in FIG. 7 than in FIG. 8, the curvature of the equipotential line is small, and the effect of electric field relaxation is large. In order to enhance the effect of electric field relaxation in the configuration (floating structure) in which the electric field relaxation layer 3 is not connected to the P body layer 8, the electric field relaxation layer 3 must be deep and thick as illustrated in FIG. 9, but it is actually difficult to manufacture such a deep electric field relaxation layer 3.

As described above, a potential of the electric field relaxation layer 3 is fixed by connecting the electric field relaxation layer 3 to the P body layer 8, and the displacement of the equipotential line can be reduced as compared with the floating structure. Thus, the bottom surface of the electric field relaxation layer 3 can be set to be shallower than the floating structure, and the electric field relaxation layer 3 can be easily formed. The electric field relaxation layer 3 may be electrically connected to the P body layer 8, and the number and form of connection portions are not particularly limited.

Figure 10A:
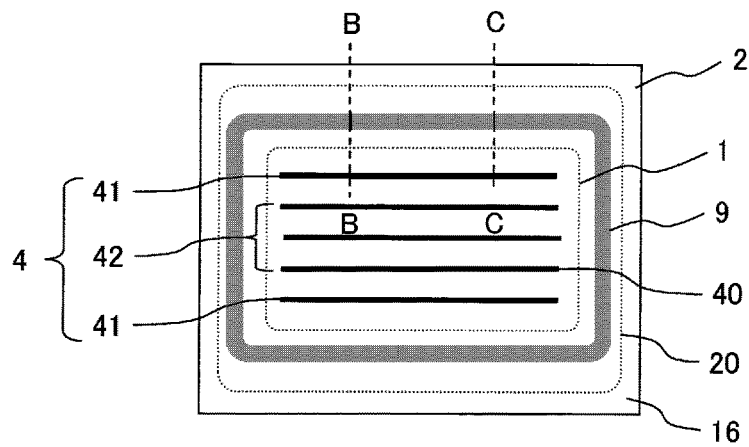
FIG. 10A is a plan view illustrating a sixth example of the semiconductor device of the present invention.
Figure 10B:
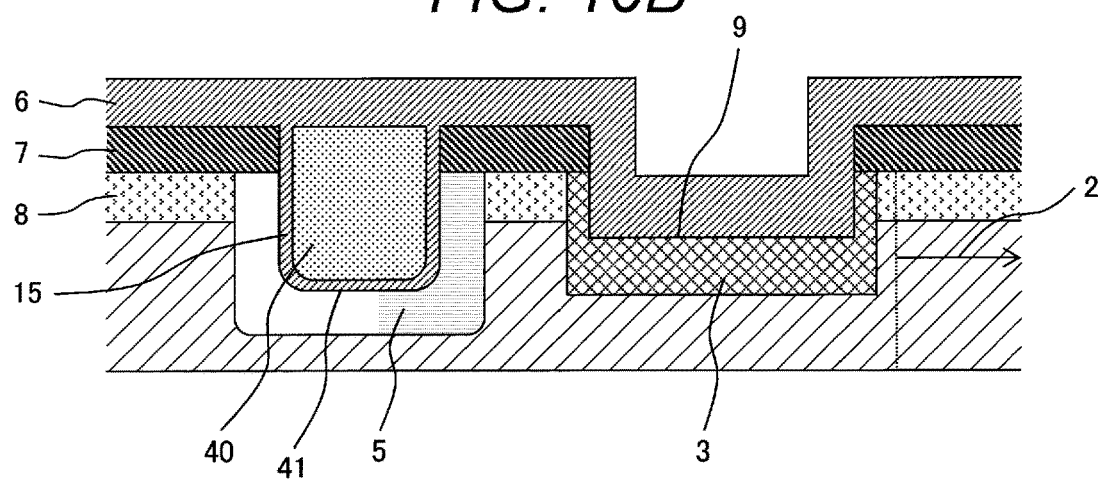
FIG. 10B is a cross-sectional view taken along line B-B in FIG. 10A.
Figure 10C:
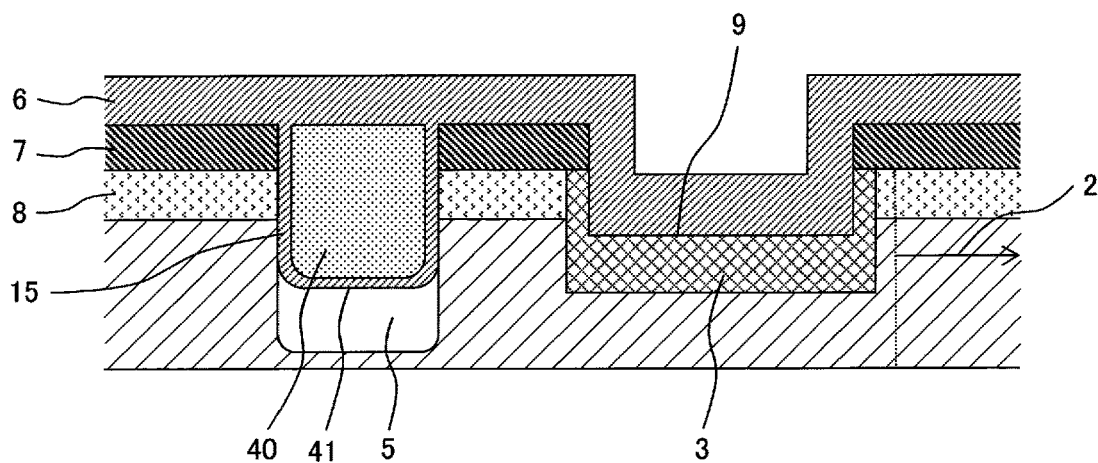
FIG. 10C is a cross-sectional view taken along line C-C in FIG. 10A.

FIG. 10A is a plan view illustrating a sixth example of the semiconductor device of the present invention, FIG. 10B is a cross-sectional view taken along line B-B in FIG. 10A, and FIG. 10C is a cross-sectional view taken along line C-C in FIG. 10A. In the drawings so far, although it has been illustrated that the electric field protection layer 5 is connected to the P body layer 8 over the entire gate trench 4 in the longitudinal direction, as illustrated in FIGS. 10B and 10C, when the electric field protection layer 5 is connected to the P body layer 8 at least at a part of the gate trench 4 in the longitudinal direction, the electric field protection layer 5 is electrically connected to the P body layer 8. Although not illustrated, the same applies to electrical connection between the electric field relaxation layer 3 and the P body layer 8. Note that although the electric connection between the electric field relaxation layer 3 and the P body layer 8 is essential, the electric field protection layer 5 may be floating without being electrically connected between the electric field protection layer 5 and the P body layer 8. Even in this case, the effect of the present invention can be obtained.

Here, the aforementioned embodiment will be described in comparison with the above-described Patent Literatures. In PTL 3, a layer corresponding to the electric field protection layer is not formed under a trench gate 20 of an element region R1 (corresponding to the active region 1), and a second diffusion layer 80 of a boundary region R3 is deeper than the trench gate 20 of the element region R1 in whole. This structure is different from the structure in which the electric field relaxation layer 3 is shallower than the electric field protection layer 5 as in the present invention. In addition, PTL 1 and PTL 2 disclose a configuration in which the floating region (second floating region 42 in PTL 1 and P floating region 53 in PTL 2) is provided in the termination area (corresponding to the termination region), but the floating structure is assumed. In a case where connection to a fixed potential instead of floating is performed, the effects described in PTL 1 and PTL 2 cannot be obtained. Specifically, in the case of PTL 1, the first distance Z1 and the second distance Z2 cannot be defined. In addition, in the case of PTL 2, as described in paragraph 0015, an object is to obtain an effect of "blocking the spreading of a depletion layer toward a termination region" by the termination trenches 62 constituting a second trench group of the termination area. Here, normally, since the depletion layer extends from a P body region 41 electrically connected to a source, the spreading of the depletion layer toward the termination region can be blocked by the termination trench 62. However, in a case where the P floating region 53 under the termination trench 62 is connected to the P body region 41 instead of being floating, since the depletion layer spreads from a portion that is the P floating region 53, the spreading of the depletion layer toward the termination region cannot be blocked by the termination trench 62. Thus, the P floating region 53 in PTL 2 needs to be floating. Accordingly, from PTL 1 and PTL 2, a technical idea of connecting the electric field relaxation layer 3 to the P body layer 8 as in the present invention cannot be obtained.

Figure 11:
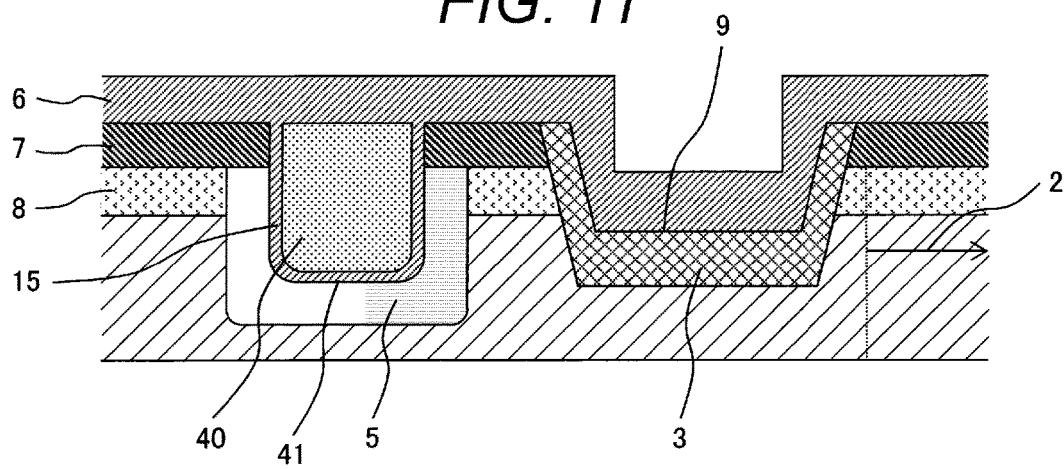
FIG. 11 is a cross-sectional view illustrating a seventh example of the semiconductor device of the present invention.

FIG. 11 is a cross-sectional view illustrating a seventh example of the semiconductor device of the present invention. As illustrated in FIG. 11, the termination trench 9 may have a tapered shape as viewed in cross section. With such a shape, the electric field relaxation layer 3 is easily formed on a sidewall of the termination trench 9 by ion implantation, the electric field relaxation layer 3 is easily connected to the P body layer 8, and the electric field applied to the electric field relaxation layer 3 is easily relaxed. In addition, since the termination trench 9 has the tapered shape, oblique implantation may not be performed during ion implantation.

Figure 12:
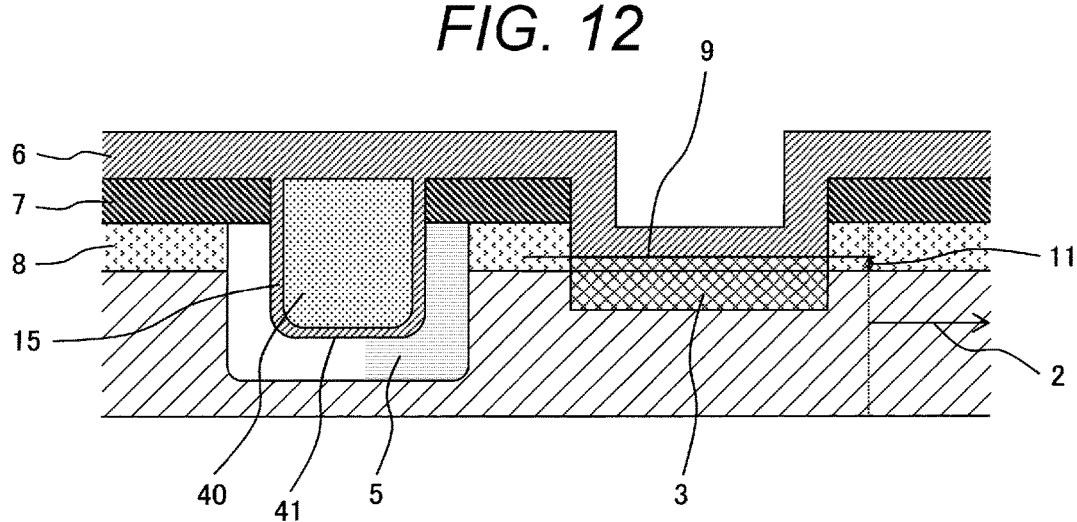
FIG. 12 is a cross-sectional view illustrating an eighth example of the semiconductor device of the present invention.

FIG. 12 is a cross-sectional view illustrating an eighth example of the semiconductor device of the present invention. In FIG. 12, the bottom surface of the termination trench 9 is shallower than a bottom surface of the P body layer 8, and an upper surface of the electric field relaxation layer 3 is shallower than the bottom surface of the P body layer 8. That is, the P body layer 8 and the electric field relaxation layer 3 overlap each other at a portion denoted by reference sign 11 in FIG. 12. With such a structure, it is possible to electrically connect the P body layer 8 and the electric field relaxation layer 3 without forming the electric field relaxation layer 3 on the sidewall of the termination trench 9. Accordingly, since it is not necessary to perform ion implantation for forming the electric field relaxation layer 3 on the sidewall of the termination trench 9, the electric field relaxation layer 3 can be easily formed. In addition, since the depth of the termination trench 9 can be reduced, it is easy to form the termination trench 9.

Figure 13:
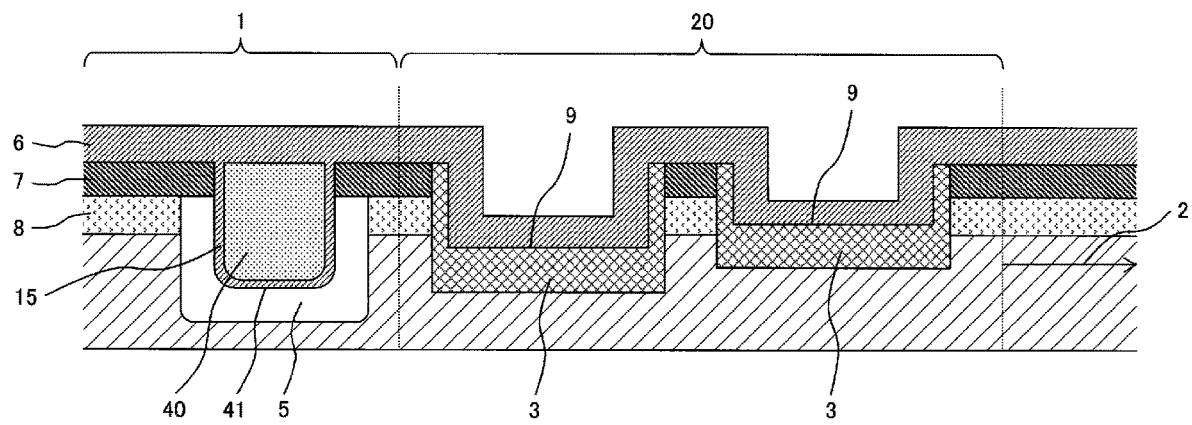
FIG. 13 is a cross-sectional view illustrating a ninth example of the semiconductor device of the present invention.

FIG. 13 is a cross-sectional view illustrating a ninth example of the semiconductor device of the present invention. In the structure illustrated in FIG. 13, a plurality of electric field relaxation layers 3 are provided between the active region 1 and the termination region 2. Bottom surfaces of the plurality of electric field relaxation layers 3 are set to be shallower from the active region 1 toward the termination region 2. With such a structure, the displacement of the equipotential line between the active region 1 and the termination region 2 can be further reduced.

Figure 14:
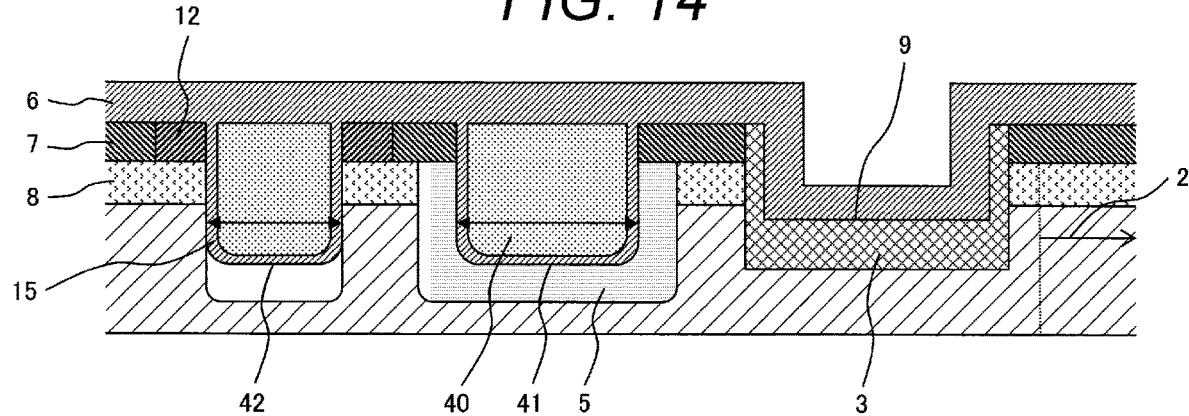
FIG. 14 is a cross-sectional view illustrating a tenth example of the semiconductor device of the present invention.

FIG. 14 is a cross-sectional view illustrating a tenth example of the semiconductor device of the present invention. In the structure illustrated in FIG. 14, a trench width of the end trench 41 is set to be larger than trench widths of the other gate trenches 4. The electric field protection layer 5 can be regarded as a P layer protruding from the P body layer 8, and the protruding electric field protection layer 5 has a large curvature of the equipotential line and a high electric field. When the trench width is increased, an area of the protruding electric field protection layer 5 is increased, the curvature of the equipotential line can be reduced, and a withstand voltage can be improved. Therefore, the trench width of the end trench 41 to which a particularly strong electric field is applied in the electric field protection layer 5 is set to be wider than the other gate trenches 4, and thus, the electric field applied to the electric field protection layer 5 can be relaxed.

Note that, with such a structure, even though the electric field relaxation layer 3 is not provided, since the electric field applied to the electric field protection layer 5 provided in the end trench 41 can be relaxed and the avalanche breakdown voltage can be improved, the electric field relaxation layer 3 may be omitted. In addition, the trench width of only the end trench 41 is not limited to be wider than the other gate trenches 4, and for example, a trench width of a plurality of gate trenches 4 including at least the end trench 41 such as the end trench 41 and one or a plurality of gate trenches 42 around the end trench 41 may be set to be larger than the other gate trenches 4. That is, widths of the gate trenches 4 arranged at least at the ends of the active region 1 may be larger than widths of the gate trenches 4 arranged at portions other than the ends of the active region 1.

Figure 15A:
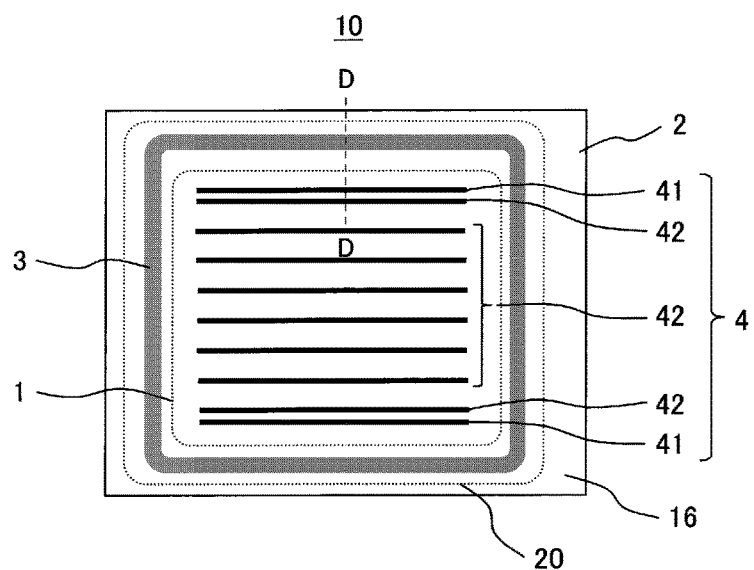
FIG. 15A is a plan view illustrating an eleventh example of the semiconductor device of the present invention.
Figure 15B:
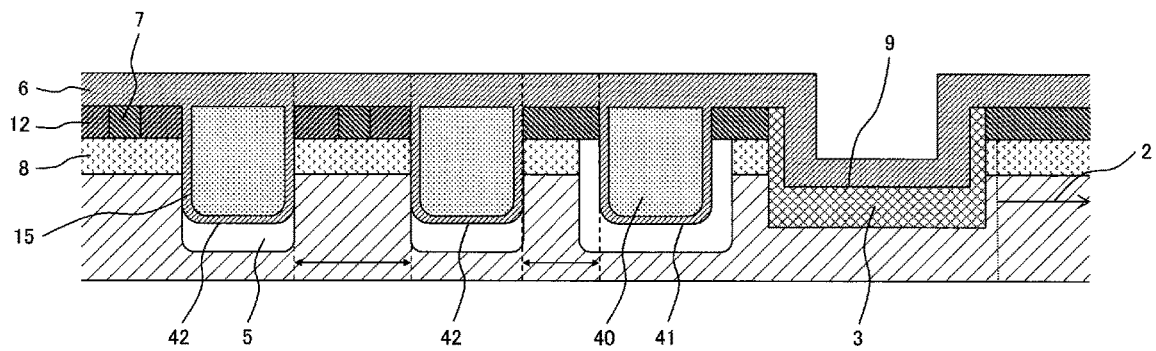
FIG. 15B is a cross-sectional view taken along line D-D in FIG. 15A.

FIG. 15A is a plan view illustrating an eleventh example of the semiconductor device of the present invention, and FIG. 15B is a cross-sectional view taken along line D-D in FIG. 15A. In the structure illustrated in FIGS. 15A and 15B, an interval between the gate trenches 4 is narrowed particularly in the end trench 41 to which a strong electric field is applied. With such a configuration, the electric field applied to the electric field protection layer 5 can be relaxed.

Note that, with such a structure, even though the electric field relaxation layer 3 is not provided, since the electric field applied to the electric field protection layer 5 provided in the end trench 41 can be relaxed and the avalanche breakdown voltage can be improved, the electric field relaxation layer 3 may be omitted. In addition, the interval between the gate trenches 4 is not limited to be narrowed only in the end trench 41, and for example, an interval between the plurality of gate trenches 4 including at least the end trench 41 such as the end trench 41 and one or a plurality of gate trenches 42 around the end trench 41 may be narrowed as compared with the other gate trenches 4. That is, an interval between the gate trenches 4 arranged at least at the ends of the active region 1 is narrower than an interval between the gate trenches 4 arranged at portions other than the ends of the active region 1.

Figure 16A:
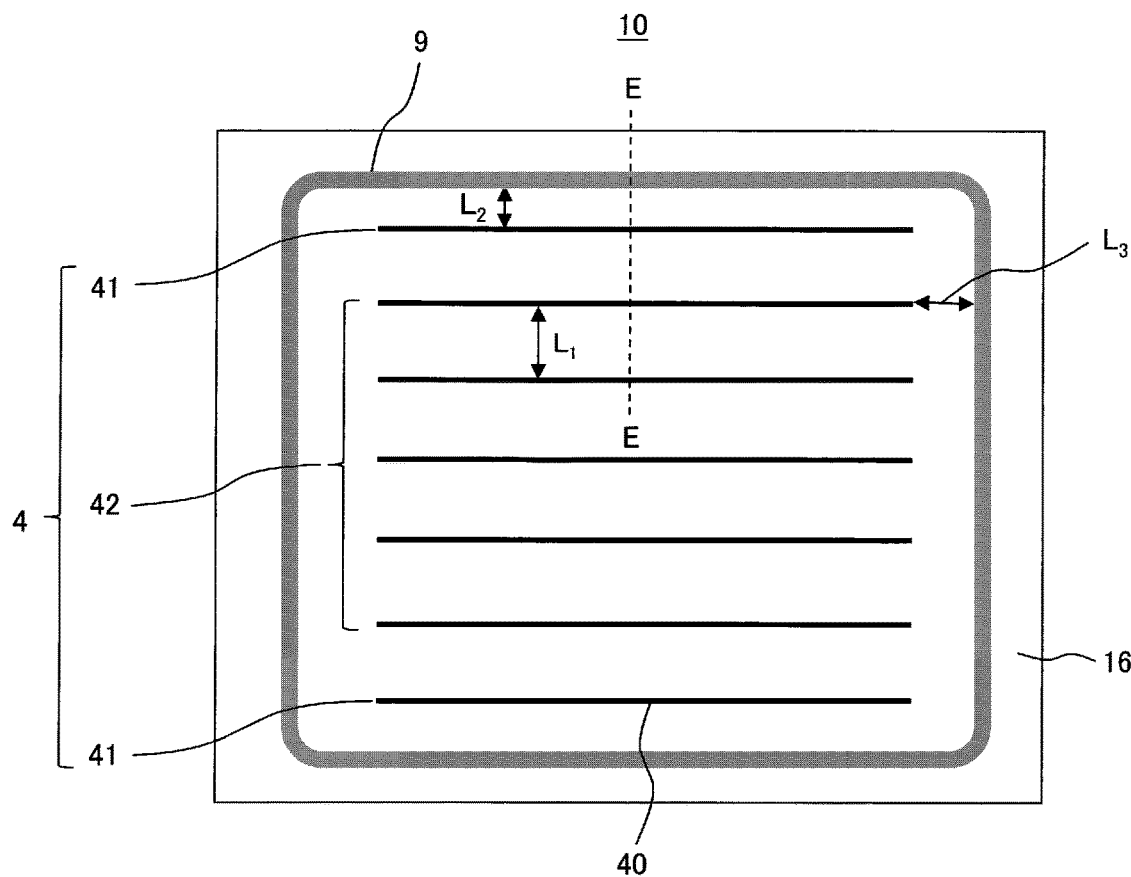
FIG. 16A is a plan view illustrating a twelfth example of the semiconductor device of the present invention.
Figure 16B:
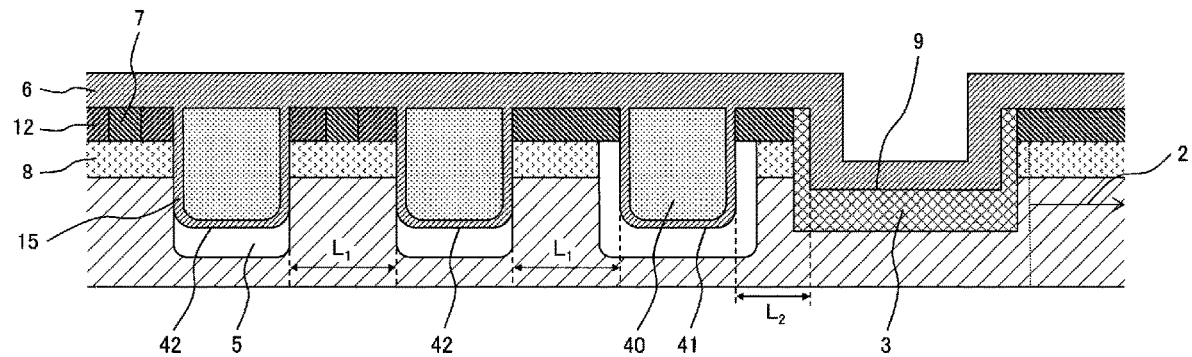
FIG. 16B is a cross-sectional view taken along line E-E of FIG. 16A.

FIG. 16A is a plan view illustrating a twelfth example of the semiconductor device of the present invention, and FIG. 16B is a cross-sectional view taken along line E-E of FIG. 16A. In the configuration illustrated in FIGS. 16A and 16B, when a distance between array directions of the gate trenches 4 of the gate trenches 4 other than the end trenches 41 which are the gate trenches 4 arranged at the ends of the active region 1 is $L_1$, a distance between array directions of the gate trenches 4 between the end trenches 41 arranged at the ends of the active region 1 and the termination trenches 9 is $L_2$, and a distance between the gate trenches 4 in the longitudinal direction between the end trenches 41 arranged at the ends of the active region 1 and the termination trenches 9 is $L_3$, a structure satisfying $L_1 \geq L_2$ and $L_1 \geq L_3$ is provided. With such a structure, the electric field applied to the electric field protection layer 5 of the end trench 41 can be relaxed. In particular, an electric field relaxation effect can be obtained when $L_1 > L_2$ and $L_1 > L_3$.

Figure 17:
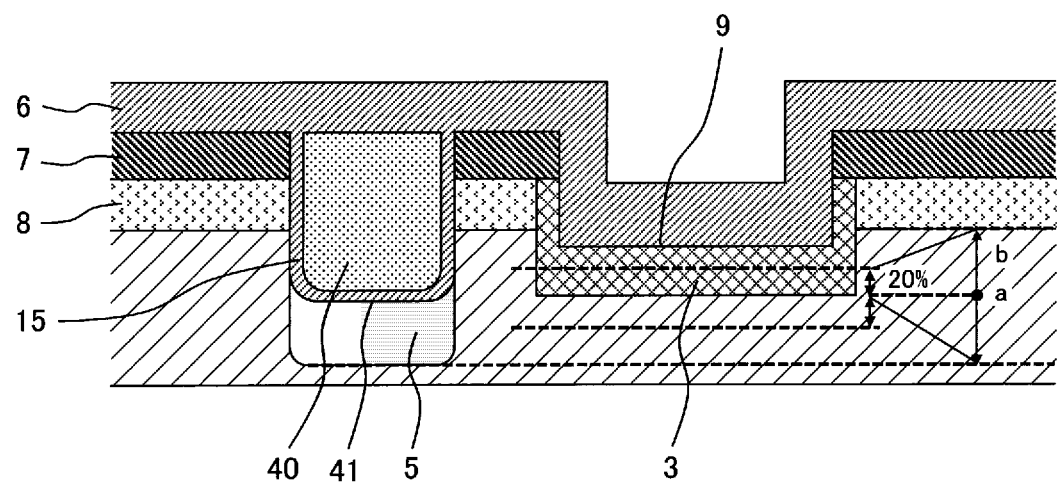
FIG. 17 is a cross-sectional view illustrating a thirteenth example of the semiconductor device of the present invention.

FIG. 17 is a cross-sectional view illustrating a thirteenth example of the semiconductor device of the present invention. As in the structure illustrated in FIG. 17, as viewed in cross section, the bottom surface of the electric field relaxation layer 3 is desirably positioned at a position within 120% of a difference between the bottom surface of the electric field protection layer 5 and the bottom surface of the P body layer 8 from an intermediate position between the bottom surface of the electric field protection layer 5 and the bottom surface of the P body layer 8.

Figure 18:
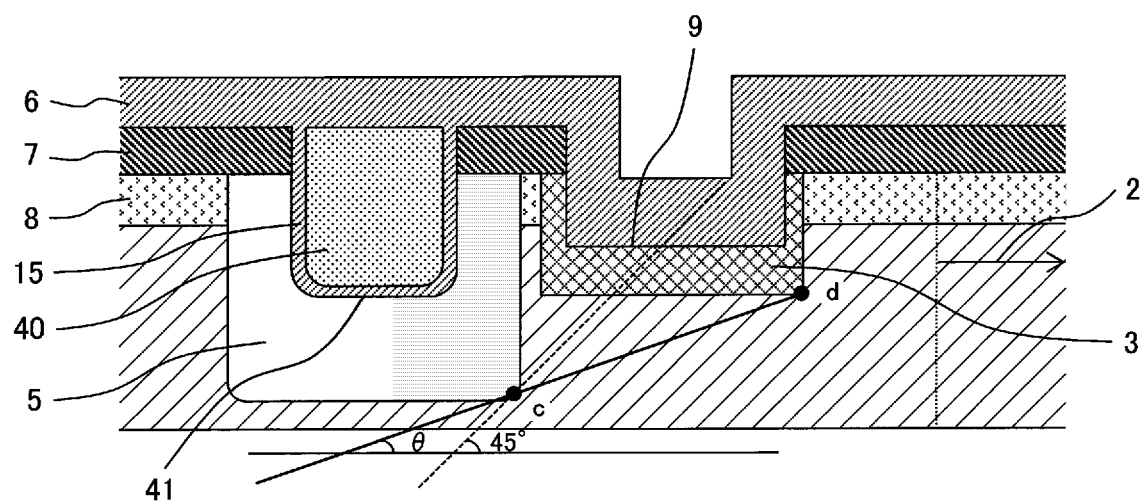
FIG. 18 is a cross-sectional view illustrating a fourteenth example of the semiconductor device of the present invention.

FIG. 18 is a cross-sectional view illustrating a fourteenth example of the semiconductor device of the present invention. As in the structure illustrated in FIG. 18, as viewed in cross section, a line connecting a corner d of the electric field relaxation layer 3 on the termination region 2 side and a corner c of the electric field protection layer 5 on the termination region 2 side desirably forms an angle of 45° or less with respect to a straight line in a horizontal direction.

Figure 19:
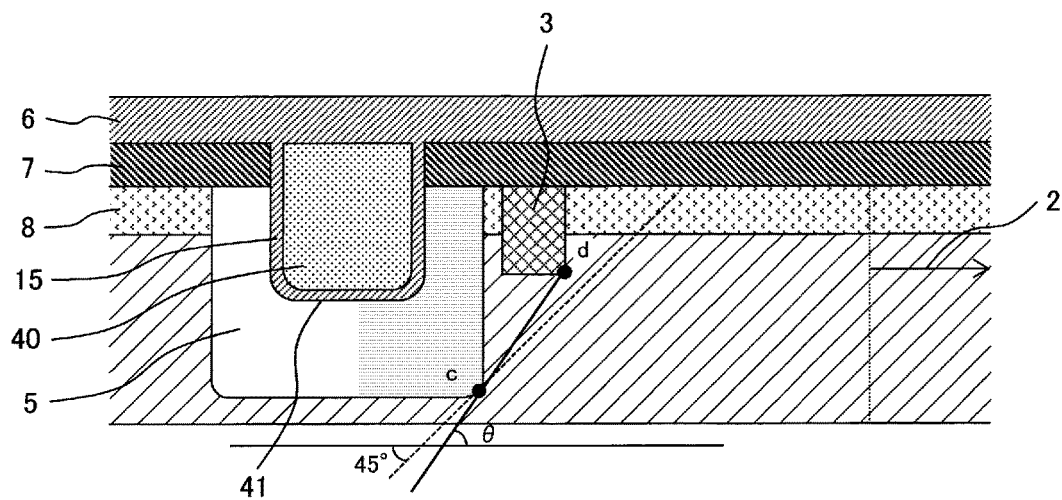
FIG. 19 is a cross-sectional view illustrating a structure to be compared with FIG. 18.

FIG. 19 is a cross-sectional view illustrating a structure to be compared with FIG. 18. In the structure illustrated in FIG. 19, the line connecting the corner d of the electric field relaxation layer 3 on the termination region 2 side and the corner c of the electric field protection layer 5 on the termination region 2 side is larger than 45° with respect to the straight line in the horizontal direction.

As described above, according to the present invention, it has been illustrated that it is possible to provide the semiconductor device in which the electric field applied to the electric field protection layer provided in the gate trench at the end of the active region is relaxed and the avalanche breakdown voltage is improved.

Note that the present invention is not limited to the aforementioned embodiment, and includes various modification examples.

For example, the aforementioned embodiment is described in detail in order to facilitate easy understanding of the present invention, and is not limited to necessarily include all the described components. In addition, some of the components of a certain embodiment can be substituted into the components of another embodiment, and the components of another embodiment can be added to the component of a certain embodiment. In addition, another component can be added, removed, and substituted to, from, and into some of the components of the aforementioned embodiment.

REFERENCE SIGNS LIST 1 active region
2 termination region
3 electric field relaxation layer
4 gate trench
41 end trench
42 gate trench other than end trench
5 electric field protection layer
6 oxide film layer
7 $P^+$ layer
8 P body layer
10 semiconductor device
9 termination trench
11 overlapped portion between P body layer and electric field relaxation layer
12, 17 $N^+$ layer
13 Field Limiting Ring structure
14 Junction Termination Extension structure
15 gate insulating film
16 substrate
20 intermediate region
21 source electrode
22 drain electrode
23 $N^-$ drift layer
40 trench gate electrode

The invention claimed is:

1. A semiconductor device that includes an active region including a plurality of gate trenches, trench gate electrodes provided in the gate trenches, and a P body layer provided at a portion other than the gate trenches, and a termination region arranged in an outer periphery of the active region, the semiconductor device comprising an electric field protection layer at a bottom of each of the gate trenches of the active region,
  wherein an electric field relaxation layer is provided between the active region and the termination region, a bottom surface of the electric field relaxation layer is shallower than a bottom surface of the electric field protection layer, and the electric field relaxation layer is electrically connected to the P body layer.

2. The semiconductor device according to claim 1, further comprising termination trenches around the active region,
  wherein the electric field relaxation layer is provided on a bottom surface side of the termination trenches.

3. The semiconductor device according to claim 2, wherein each of the termination trenches has a tapered shape as viewed in cross section.

4. The semiconductor device according to claim 2, wherein a bottom surface of each of the termination trenches is shallower than a bottom surface of the P body layer, and an upper surface of the electric field relaxation layer is shallower than the bottom surface of the P body layer.

5. The semiconductor device according to claim 2, wherein, when a distance between array directions of the gate trenches other than the gate trenches arranged at ends of the active region is $L_1$, a distance between array directions of the gate trenches between the gate trenches arranged at the ends of the active region and the termination trenches is $L_2$, and a distance between the gate trenches in a longitudinal direction between the gate trenches and the termination trenches is $L_3$, $L_1 \geq L_2$ and $L_1 \geq L_3$ are satisfied.

6. The semiconductor device according to claim 1, wherein an interval between the gate trenches arranged at least at ends of the active region is wider than an interval between the gate trenches arranged at portions other than the ends of the active region.

7. The semiconductor device according to claim 1, wherein widths of the gate trenches arranged at least at ends of the active region are wider than widths of the gate trenches arranged at portions other than the ends of the active region.

8. The semiconductor device according to claim 1, wherein, as viewed in cross section, the bottom surface of the electric field relaxation layer is positioned at a depth within ±20% of a difference between the bottom surface of the electric field protection layer and the bottom surface of the P body layer from an intermediate position between the bottom surface of the electric field protection layer and the bottom surface of the P body layer.

9. The semiconductor device according to claim 1, wherein, as viewed in cross section, a line connecting a corner of the electric field relaxation layer on a termination region side and a corner of the electric field protection layer on a termination region side forms an angle of 45° or less with respect to a straight line in a horizontal direction.

10. The semiconductor device according to claim 1, wherein the electric field protection layer is electrically connected to the P body layer at at least one portion.

11. The semiconductor device according to claim 1, wherein the gate trenches arranged at ends of the active region are dummy trenches, and the electric field protection layer is provided on bottoms of the dummy trenches.

12. The semiconductor device according to claim 1, wherein the electric field protection layer is provided on side surfaces on a termination region side or both side surfaces of the gate trenches arranged at ends of the active region.

13. The semiconductor device according to claim 12, wherein the electric field relaxation layer is in contact with the electric field protection layer provided on each of side surfaces of the gate trenches arranged at the ends of the active region.

14. The semiconductor device according to claim 1, wherein the electric field relaxation layer is in contact with ends of the gate trenches in a longitudinal direction.

15. The semiconductor device according to claim 1, wherein a plurality of the electric field relaxation layers are provided, and bottom surfaces of the plurality of electric field relaxation layers become shallower from the active region toward the termination region.

* * * * *